United States Patent
Dhong et al.

(10) Patent No.: US 7,113,443 B2
(45) Date of Patent: Sep. 26, 2006

(54) METHOD OF ADDRESS DISTRIBUTION TIME REDUCTION FOR HIGH SPEED MEMORY MACRO

(75) Inventors: Sang Hoo Dhong, Austin, TX (US); Hiroaki Murakami, Austin, TX (US); Shohji Onishi, Shiga-ken (JP); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 10/965,627

(22) Filed: Oct. 14, 2004

(65) Prior Publication Data

US 2006/0083101 A1    Apr. 20, 2006

(51) Int. Cl.
*G11C 8/00*   (2006.01)
(52) U.S. Cl. .............................. 365/230.03; 365/230.08
(58) Field of Classification Search ........... 365/230.03, 365/230.08, 233
See application file for complete search history.

(56) References Cited

U.S. PATENT DOCUMENTS 5,894,448 A * 4/1999 Amano et al. ......... 365/230.08
6,587,391 B1 * 7/2003 Jung et al. ............. 365/230.03

* cited by examiner

*Primary Examiner*—Vu A. Le
(74) *Attorney, Agent, or Firm*—Carr LLP; Diana R. Gerhardt (57) ABSTRACT

An apparatus, a method, and a computer program product are provided for time reduction and energy conservation during address distribution in a high speed memory macro. To address these concerns, this design divides the typical data arrays into sets of paired subarrays, divides the conventional memory address latches into separate sets, and interposes one set of memory address latches between each pair of subarrays. Therefore, time is saved because the address signals have less wire length to travel and energy is saved because only one set of address latches needs to be powered on for each transmission.

17 Claims, 6 Drawing Sheets

*PRIOR ART*

METHOD OF ADDRESS DISTRIBUTION TIME REDUCTION FOR HIGH SPEED MEMORY MACRO

BACKGROUND OF THE INVENTION

1. Field of the Invention

The present invention relates generally to address distribution in a high speed memory macro, and more particularly, to a method of time reduction and energy conservation during address distribution in a high speed memory macro.

2. Description of the Related Art

High speed macros are used to realize high-performance operation of data processing systems and network designs. Specifically, high speed memory macros are used to distribute signals that can be stored as addresses. There is a constant search to decrease the time delay involved with distributing these address signals and to reduce the power involved with operating these macros. A high speed memory macro that distributes signals faster and with less power will be superior.

Figure 1:
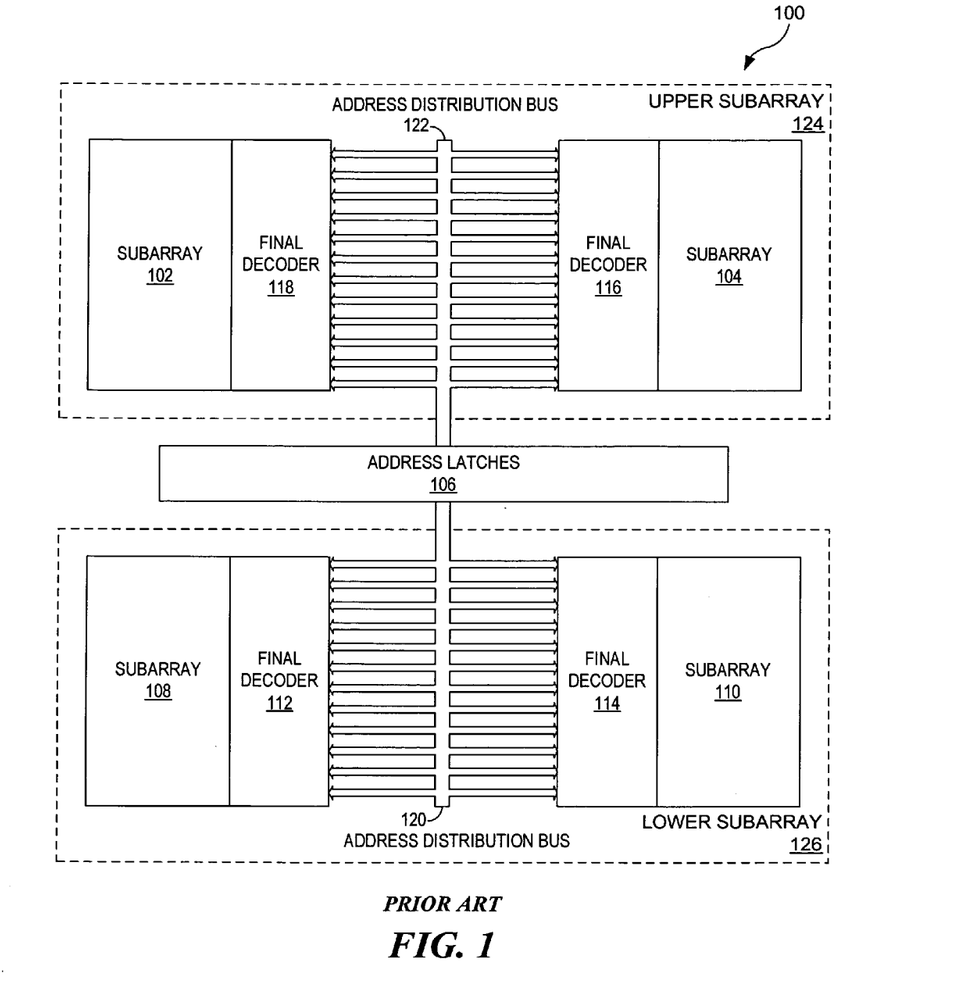
FIG. 1 schematically depicts a conventional high speed memory macro.

Traditionally, in memory design one set of address latches is used to store information inside a high speed memory macro. The address latches are placed in the center of the macro and are surrounded by subarrays. The address latches use an address distribution bus to distribute the address signal to the correct subarray and a final decoder to fully decode the specific address signal. Referring to FIG. 1 of the drawings, the reference numeral 100 generally designates a conventional high speed memory macro.

As shown in FIG. 1, the address latches 106 are located in the middle of the macro and are surrounded by the subarrays 102, 104, 108 and 110. The subarrays 102 and 104 make up the upper subarray 124 and the subarrays 108 and 110 make up the lower subarray 126. As a signal leaves the address latches it travels through the address distribution bus 120 or 122. These address distribution buses direct the signal to the correct position in the subarrays. Address distribution bus 120 will be used to distribute an address signal to the lower subarray 126, and address distribution bus 122 will be used to distribute an address signal to the upper subarray 124. The address distribution bus distributes the address signal to the correct subarray, but before reaching the subarray the signal will pass through a final decoder 112, 114, 116, or 118. This final decoder is used to fully decode the signal before it is stored in the correct subarray. Accordingly, final decoder 118 will decode a signal that is destined for subarray 102.

According to FIG. 1, an address signal destined for the upper subarray must travel up the address distribution bus 122 to the final decoder 116 or 118 and into the correct subarray 104 or 102, respectively. The problem with this design is that the address signals need to travel half of the length of a memory array height. This memory array height is determined by the number of entries in the array and the actual cell height. A shorter wire length will allow the signal to be distributed faster and with greater precision. Any extra wire length will affect the distribution delay, skew, and slope of the signal.

Figure 2:
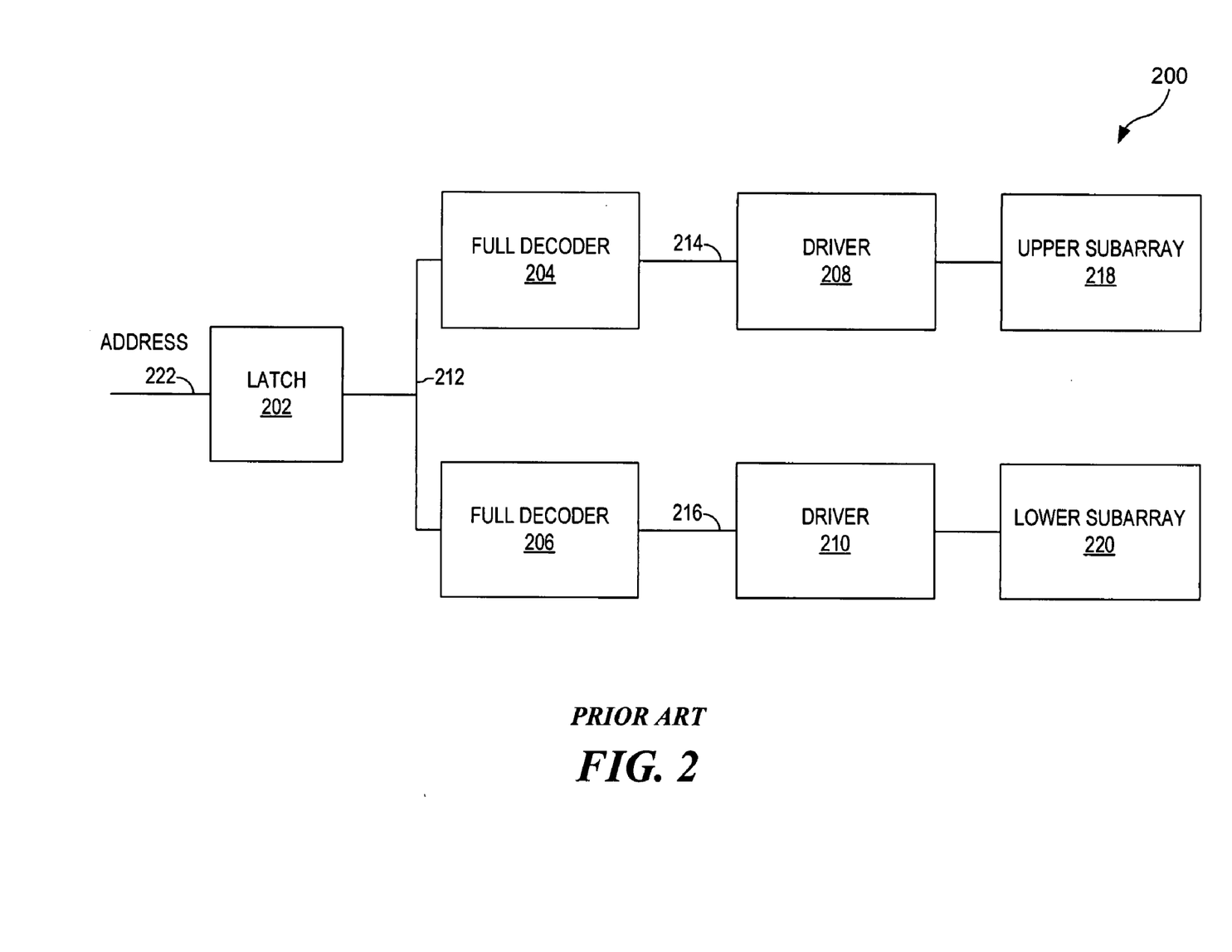
FIG. 2 is a block diagram illustrating address signal distribution in the conventional high speed memory macro.

Referring to FIG. 2 of the drawings, reference numeral 200 generally designates a block diagram illustrating address signal distribution in a high speed memory macro. After a signal enables the address latch 202, the address signal 222 will be distributed by this latch 202 through a communication channel 212. This signal that enables the address latch 202 is produced by a global clock signal. Through the latch 202 this address signal 222 will be destined for the upper subarray 218 or the lower subarray 220. The communication channel 212 will then distribute this signal to a full decoder 204 or 206. Full decoder 204 will be used for the upper subarray 218 and full decoder 206 will be used for the lower subarray 220. After the signal is decoded a communication channel 214 or 216 will direct the signal to a driver 208 or 210, respectively. The driver 208 or 210 will then distribute the decoded signal to the upper subarray 218 or the lower subarray 220. Accordingly, driver 208 is used for an address signal that will be stored in the upper subarray 218 and driver 210 is used for an address signal that will be stored in the lower subarray 220.

One drawback of this design is that the address latches have to be powered on every time that a signal is destined for the upper subarray or the lower subarray. As FIG. 2 depicts, the latch 202 is powered up every time a signal is distributed. Therefore, there is a need for a method and/or apparatus to modify conventional high speed memory macros that address at least some of the problems associated with conventional high speed memory macros.

SUMMARY OF THE INVENTION

The present invention provides a method, an apparatus, and a computer program for the reduction of time delay and the conservation of energy during address signal distribution inside a high speed memory macro. The memory array in a conventional macro is divided into pairs of subarrays. Conventional memory address latches are also divided into separate sets of address latches. One set of memory address latches is interposed between each pair of subarrays. These address latches are configured to receive a global address signal and distribute that signal to the proper subarray. Before being stored in the proper subarray, the address signal is fully decoded by a final decoder. Further, a predecoder is combined with these sets of address latches to partially decode an address signal before it is distributed by the address latches. In addition, an enabling circuit is implemented to activate only the set of address latches that will be necessary for the specific address distribution. This design decreases time delay by shortening the wire length involved with address signal distribution and conserves energy by disabling one set of address latches during each address signal distribution.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

Figure 3:
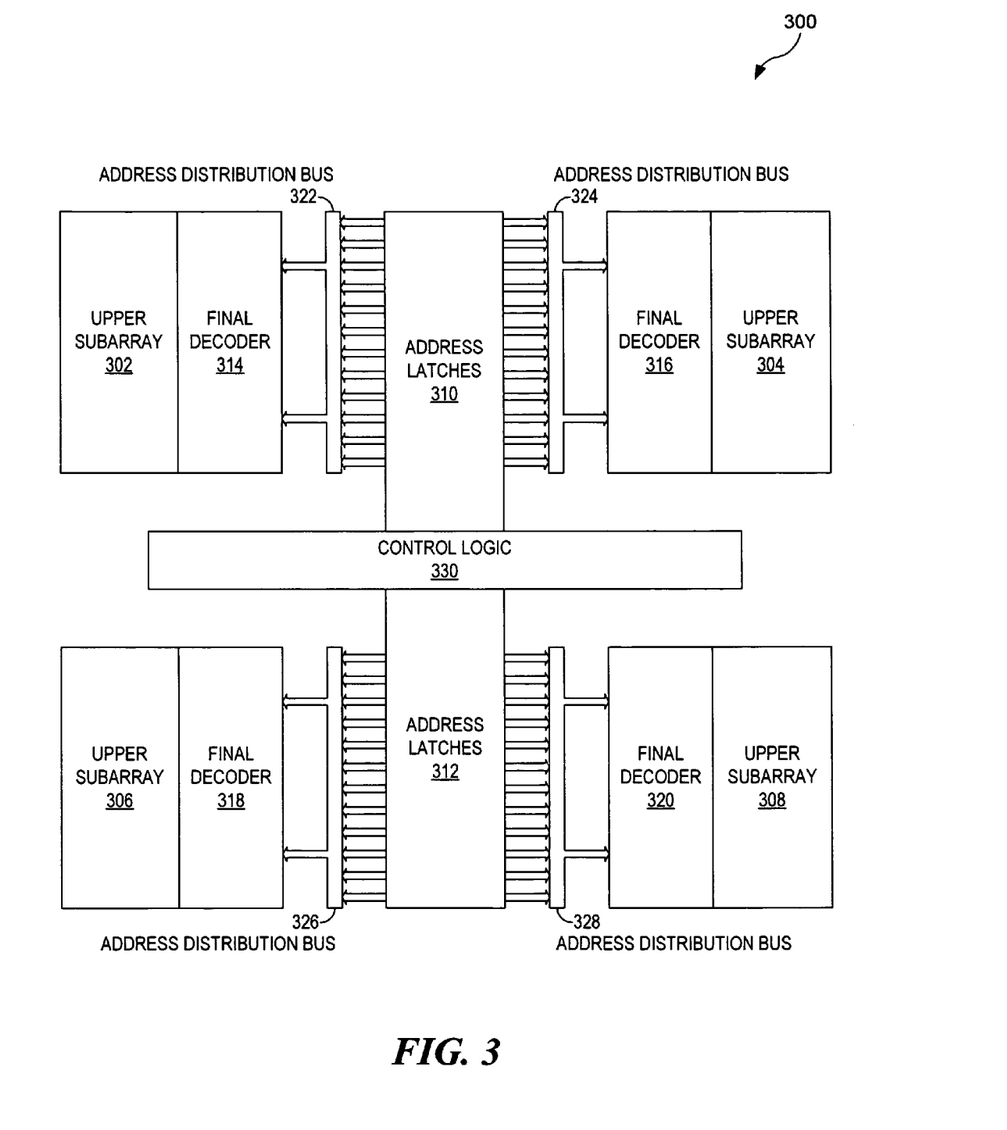
FIG. 3 schematically depicts a modified high speed memory macro.

Referring to FIG. 3 of the drawings, the reference numeral 300 designates a modified high speed memory macro, wherein two sets of address latches 310 and 312 are placed in the center of the upper subarray 302 and 304 and in the center of the lower subarray 306 and 308, respectively. A control signal is generated by the control logic 330 and is sent to the address latches 310 or 312. This control signal enables the correct set of address latches. Address latch 310 is powered on for the distribution of an address signal that is destined for the upper subarray 302 or 304 and address latch 312 is powered on for the distribution of an address signal that is destined for the lower subarray 306 or 308. These address latches and the address distribution buses 322, 324, 326 and 328 distribute the address signal to the correct destination. Accordingly, address distribution bus 322 distributes a signal to upper subarray 302. After the address distribution bus determines where the signal will be distributed, the final decoders 314, 316, 318 and 320 fully decode the address signal. Accordingly, final decoder 316 decodes a signal that is destined to be stored at upper subarray 304. Finally, a fully decoded address signal is stored in the correct subarray.

This design clearly shortens the wire length that is needed to distribute a decoded address signal to the correct subarray. The address signal no longer has to travel half of the length of the memory array height to reach the upper subarray. The new placement of the address latches allows an address signal to travel directly to the subarrays. A shorter wire length decreases the address signal distribution delay and enhances the precision of the signal. Another advantage of this design is that only the upper address latches 310 need to be powered on to distribute a signal to the upper subarrays 302 or 304. Therefore, when distributing an address signal to the upper subarray the lower address latches 312 can remain powered off. Because these address latches 310 and 312 are smaller in size than the address latches 106 in FIG. 1, the address latches 310 and 312 will use less power.

Figure 4:
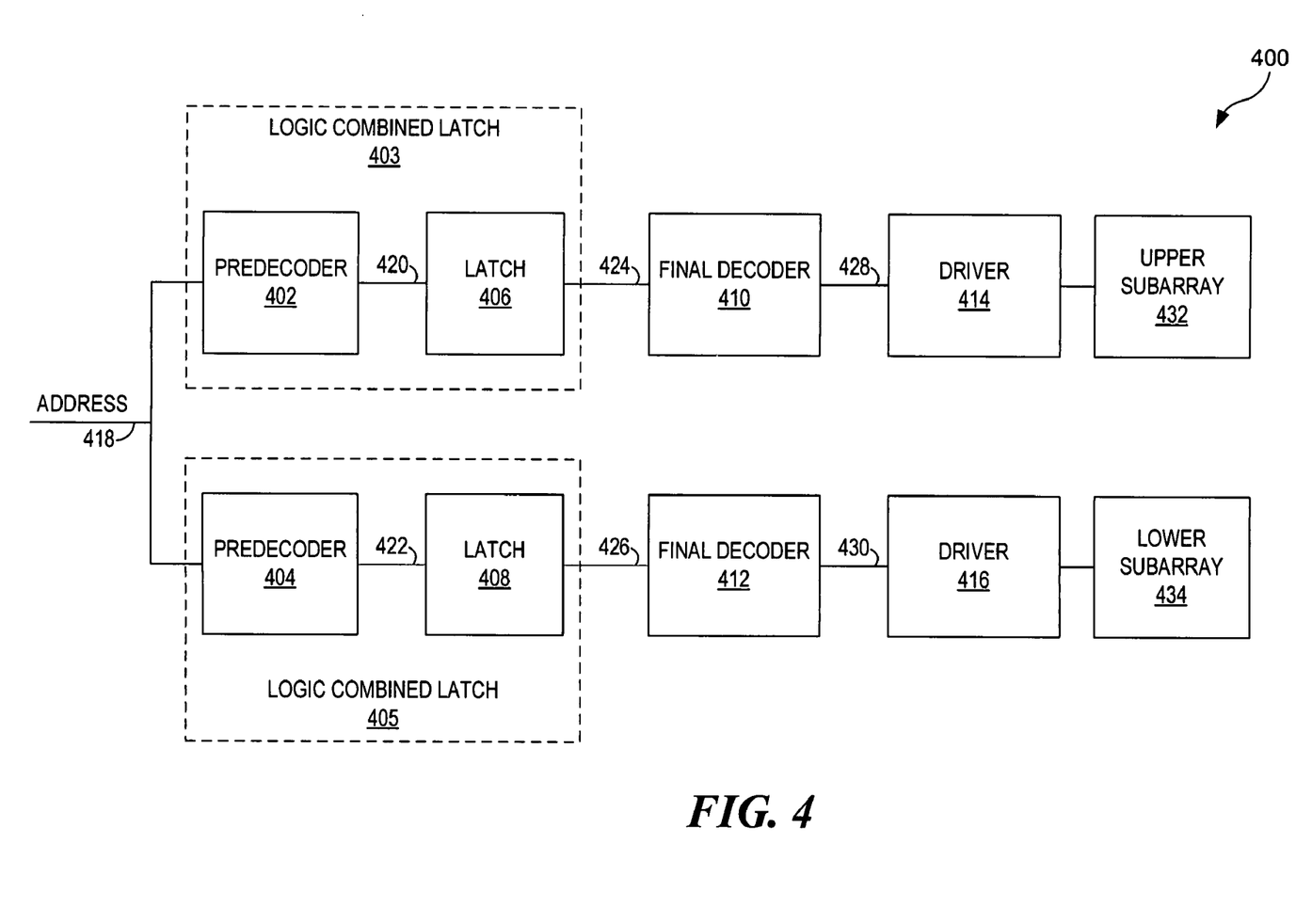
FIG. 4 is a block diagram illustrating the process by which a decoded address signal is distributed to the subarrays in the modified high speed memory macro.

Referring to FIG. 4 of the drawings, the reference numeral 400 generally depicts a block diagram illustrating the process by which an address signal is distributed to the subarrays in this modified design of a high speed memory macro. First, the address signal 418 is partially decoded by a predecoder 402 or 404. Accordingly, if the address signal is destined for the upper subarray 432 then it will be partially decoded by predecoder 402, and if the address signal is destined for the lower subarray 434 then it will be partially decoded by predecoder 404. After this decoding process, a decoded signal is transmitted through a communication channel 420 or 422 to a latch 406 or 408, respectively. The predecoder 402 connected to latch 406 is denoted as logic combined latch 403, and the predecoder 404 connected to latch 408 is denoted as logic combined latch 405. Thus, partially decoded address signals are stored at the address latches 406 and 408. When a signal is to be distributed from logic combined latches 403 or 405, a communication channel 424 or 426 relays the signal to the final decoder 410 or 412, respectively. These final decoders 410 and 412 contain less logic than the full decoders 204 and 206 in FIG. 2 due to the partial decoding done by the predecoders 402 and 404. Then the decoded signal is sent through another communication channel 428 or 430 to the driver 414 or 416. Accordingly, driver 414 will distribute the decoded address signal to the upper subarray 432 and driver 416 will distribute the signal to the lower subarray 434.

FIG. 4 shows that an address signal that is destined for the upper subarray 432 will not pass through the lower logic combined latch 405. This design will save power by allowing the lower logic combined latch 405 to remain off during this signal distribution. FIG. 4 also shows that the signal delay time will be decreased because the address signal has been partially predecoded before it was stored in the latch. Therefore, a signal will only need to be partially decoded by the final decoder before it reaches the subarray. This combination of the predecoders with the address latches is not an essential element of this invention, but it will reduce the signal delay inside the macro.

Figure 5:
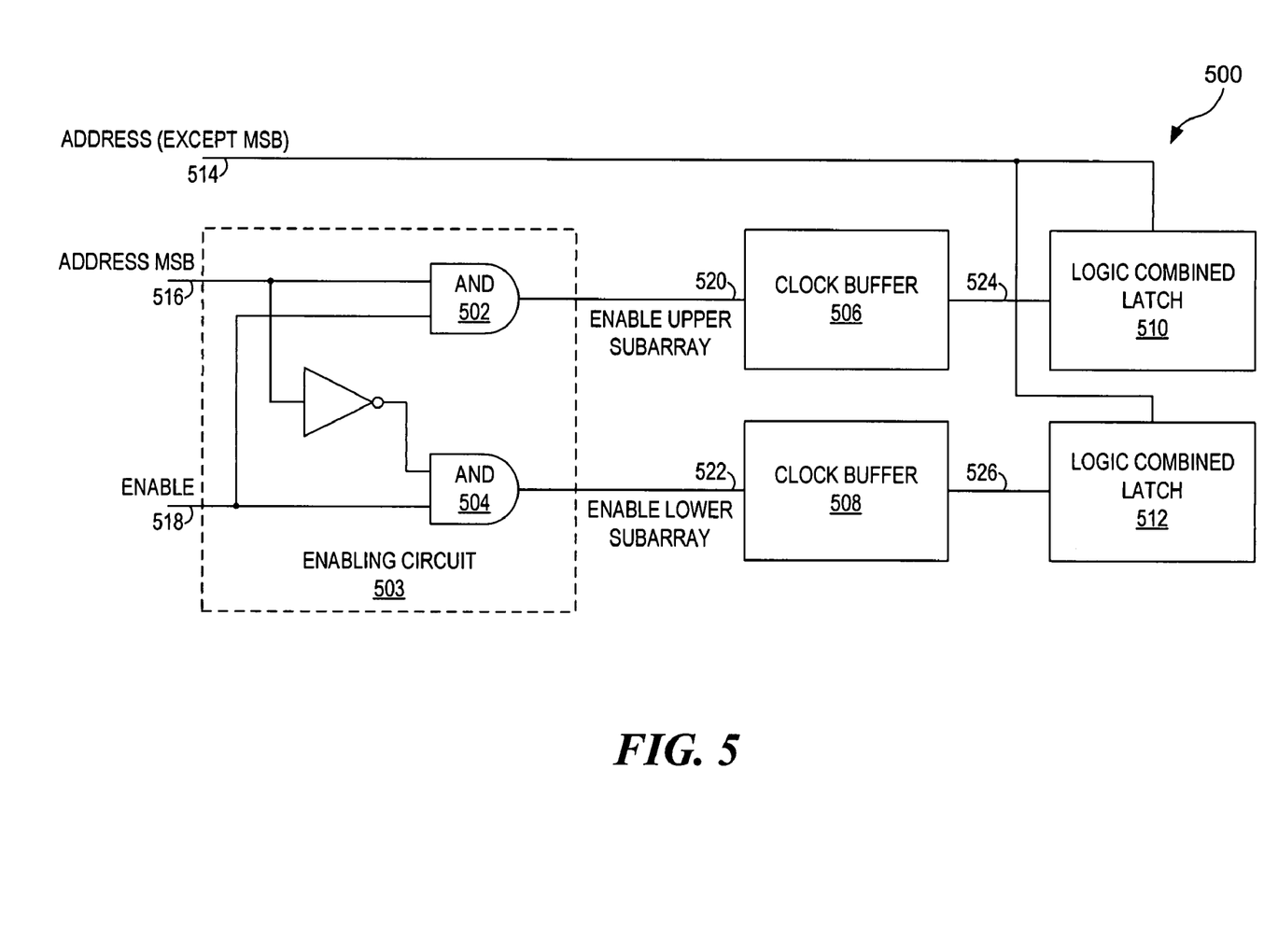
FIG. 5 is a block diagram illustrating a modified address latch control wherein the address MSB will enable the upper subarray address latches or the lower subarray address latches.

Referring to FIG. 5 of the drawings, the reference numeral 500 depicts a latch control that can be used to enable the correct set of address latches. The incoming address signal (except the Most Significant Bit (MSB)) 514 corresponds to the address signal 418 in FIG. 4. The logic combined latches 510 and 512 correspond to the logic combined latches 403 and 405 in FIG. 4, respectively. The address signal MSB 516 is an input of AND gate 502 and, through an inverter, it is also an input of AND gate 504. The enable signal 518, which is a clock signal, is connected to AND gate 502 and AND gate 504 as inputs. This logic is designed to enable the upper subarray or the lower subarray, but not both. This logic can exist at the center of the macro, but in actual design this logic is housed with the address latches to minimize wire length. The enabling circuit is denoted as reference numeral 503. Communication channels 520 and 522 deliver the signal to the clock buffers 506 and 508, respectively. After passing through the clock buffer 506 or 508, the signal is connected by a communication channel 524 or 526 to the logic combined latch 510 or 512, respectively. In essence, if the address signal is destined for the upper subarray then only the logic combined latch 510 will be powered on and logic combined latch 512 will remain off. This latch control enables this modified high speed memory macro to conserve power by only activating one set of address latches for each address signal distribution. This is one example of how this latch control may be accomplished, but many other circuit designs can achieve accomplish the same result.

Figure 6:
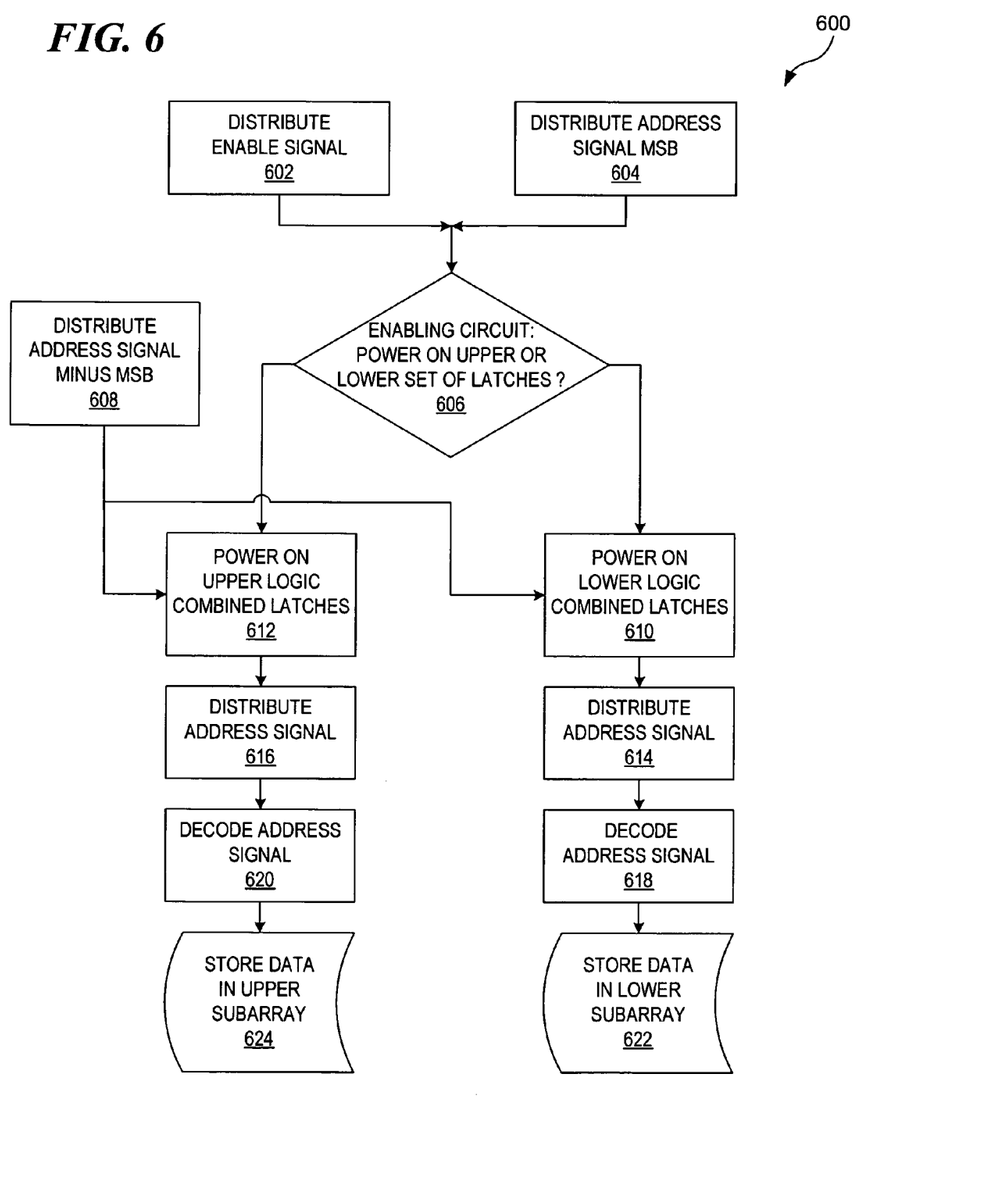
FIG. 6 is a flow chart illustrating the process of address signal distribution in the modified high speed memory macro.

Referring to FIG. 6 of the drawings, reference numeral 600 depicts a flow chart illustrating the process of address distribution in a modified high speed memory macro. The process begins in step 602 with distributing an enable signal (clock signal) 518 to the enabling circuit 503. Concurrently, in step 604 the address signal MSB 516 is distributed to the enabling circuit 503. During step 606 the enabling circuit 503 determines which set of latches is powered on. When the enable signal 518 goes high, the address signal MSB 516 is used to determine whether the upper logic combined latch 510 or the lower logic combined latch 512 is powered on, and this determination is made in step 606. Concurrently, in step 608 the address signal minus the MSB 514 is distributed to both logic combined latches. If the upper logic combined latch 510 is powered on in step 612, then in step 616 an address distribution bus distributes the address signal (minus the MSB) 514 to be decoded. If the lower combined latch 512 is powered on in step 610, then in step 614 an address distribution bus distributes the address signal (minus the MSB) 514 to be decoded. The address signal is fully decoded in steps 620 and 618, respectively. Finally, the fully decoded address signals are stored in the correct subarray during steps 624 or 622, respectively. Accordingly, if the upper logic combined latch 510 was powered on in step 612, then in step 624 the fully decoded address signal is stored in the upper subarray, and if the lower logic combined latch 512 was powered on in step 610, then in step 622 the fully decoded address signal is stored in the lower subarray.

It is understood that the present invention can take many forms and embodiments. Accordingly, several variations of the present design may be made without departing from the scope of the invention. The capabilities outlined herein allow for the possibility of a variety of programming models. This disclosure should not be read as preferring any particular programming model, but is instead directed to the underlying concepts on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. An apparatus distributing data in a memory macro, comprising:
   a plurality of paired subarrays;
   a plurality of sets of memory address latches, wherein at least one set of memory address latches is at least configured to be interposed between each subarray of each subarray pair of one of the plurality of paired subarrays and;
   wherein the plurality of sets of memory address latches is configured to acquire a global address signal from outside the memory macro and to activate only one of the plurality of paired subarrays in response to the acquired global address signal.

2. The apparatus of claim 1, wherein the plurality of memory address latches is at least configured to receive an address signal and distribute a time delayed address signal.

3. The apparatus of claim 1, wherein the apparatus further comprises:
   a plurality of address distribution buses, wherein each address distribution bus of the plurality of address distribution buses is at least configured to receive a time delayed address signal from at least one set of memory address latches of the plurality of the sets of memory addresses latches and is at least configured to distribute the time delayed address signal;
   a plurality of final decoders, wherein each final decoder of the plurality of final decoders is at least configured to receive the time delayed address signal from at least one address distribution buses of the plurality of address distribution buses and is at least configured to generate a decoded address signal; and
   a plurality of drivers, wherein each driver of the plurality of drivers is at least configured to receive the decoded address signal from at least one final decoder of the plurality of full decoders and is at least configured to distribute the decoded address signal.

4. The apparatus of claim 1, wherein the plurality of memory address latches further comprise a plurality of sets of predecoders, wherein at least one set of predecoders is combined with at least one set of memory address latches.

5. The apparatus of claim 4, wherein each predecoder of the at least one set of predecoders is at least configured to partially decode a global address signal and to distribute a predecoded address signal to the at least one set of memory address latches of the plurality of sets of memory address latches.

6. The apparatus of claim 1, wherein the apparatus further comprises an enabling circuit that is at least configured to enable one set of memory address latches.

7. The apparatus of claim 6, wherein the enabling circuit at least further comprises a plurality of AND gates, wherein each AND gate of the plurality of AND gates is at least configured to receive an enabling clock signal and a global address signal and is configured to output a latch enabling signal to at least one set of memory latches.

8. The apparatus of claim 7, wherein the plurality of memory latches are at least configured to accept the global address signal minus the global address signal MSB.

9. The apparatus of claim 7, wherein the enabling circuit further comprises a plurality of buffers, wherein each buffer of the plurality of buffers is at least configured to receive the output of at least one AND gate of the plurality of AND gates and is at least configured to distribute the enabling signals to at least one set of memory address latches of the plurality of sets of memory latches.

10. The apparatus of claim 6, wherein the plurality of memory address latches further comprise a plurality of sets of predecoders, wherein at least one set of predecoders is combined with at least one set of memory address latches.

11. The apparatus of claim 10, wherein each predecoder of the plurality of sets of predecoders is at least configured to partially decode the global address signal minus the MSB and is at least configured to distribute a predecoded address signal to the at least one set of memory address latches of the plurality of sets of memory address latches.

12. A method for reducing distribution time and saving power for a high speed memory macro in a processor system having a set of memory array address latches, and a memory address decoder, comprising:
   dividing said memory array into an upper subarray and a lower subarray;
   grouping the address latches as an upper subarray set and a lower subarray set;
   segmenting a portion of the decoder into the address latches;
   acquiring global address signals from outside said macro by either the upper subarray set or the lower subarray set; and
   activating only the upper subarray set or the lower subarray set in response to said acquiring.

13. The method of claim 12, wherein the step of dividing the memory array further comprises dividing said memory array into four subarrays, wherein two subarrays comprise the upper subarray and two subarrays comprise the lower subarray.

14. The method of claim 12, wherein the step of grouping the memory array address latches further comprises:
   housing the upper subarray set of address latches directly between the two upper subarrays; and
   housing the lower subarray set of address latches directly between the two lower subarrays.

15. The method of claim 12, wherein the step of segmenting a portion of a memory address decoder into the memory array address latches, further comprises:
   generating a partially decoded address signal; and
   storing the partially decoded address signal in the address latches.

16. The method of claim 12, wherein the step of activating only the upper subarray set of address latches or the lower subarray set of address latches in response to said acquiring, further comprises implementing an enabling circuit.

17. The method of claim 16, wherein the step of implementing the enabling circuit, further comprises:
   inputting an outside global address signal and an enabling signal into the enabling circuit; and
   disabling the upper subarray set of address latches or the lower subarray set of address latches.

* * * * *